(12) United States Patent
Roy

(10) Patent No.: US 12,543,388 B2
(45) Date of Patent: Feb. 3, 2026

(54) PHOTOSENSITIVE SENSOR AND CORRESPONDING MANUFACTURING METHOD

(71) Applicant: STMicroelectronics (Crolles 2) SAS, Crolles (FR)

(72) Inventor: Francois Roy, Seyssin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 788 days.

(21) Appl. No.: 17/840,027

(22) Filed: Jun. 14, 2022

(65) Prior Publication Data

US 2022/0406837 A1 Dec. 22, 2022

(30) Foreign Application Priority Data

Jun. 16, 2021 (FR) ...................................... 2106356

(51) Int. Cl.
H10F 39/18 (2025.01)
H10F 39/00 (2025.01)

(52) U.S. Cl.
CPC ......... *H10F 39/184* (2025.01); *H10F 39/014* (2025.01); *H10F 39/021* (2025.01)

(58) Field of Classification Search
None
See application file for complete search history.

(56) References Cited

U.S. PATENT DOCUMENTS

| 7,618,839 B2 * | 11/2009 | Rhodes | H10F 39/807 257/292 |
| 8,531,567 B2 | 9/2013 | Roy et al. | |
| 2007/0152292 A1 * | 7/2007 | Toros | H10F 39/803 348/E5.081 |
| 2009/0309158 A1 * | 12/2009 | Lin | H10D 30/711 365/182 |
| 2009/0325337 A1 * | 12/2009 | Cheng | H10F 39/014 257/E31.127 |
| 2012/0038811 A1 * | 2/2012 | Ellis-Monaghan | H04N 25/62 348/308 |
| 2017/0018584 A1 | 1/2017 | Ma et al. | |

(Continued)

FOREIGN PATENT DOCUMENTS

| CN | 104183610 A | 12/2014 |
| CN | 217983373 U | 12/2022 |

(Continued)

OTHER PUBLICATIONS

INPI Search Report and Written Opinion for priority application, FR 2106356, report dated Dec. 14, 2021, 10 pgs.

(Continued)

*Primary Examiner* — Nilufa Rahim
(74) *Attorney, Agent, or Firm* — Crowe & Dunlevy LLC

(57) ABSTRACT

A photosensitive sensor includes a pixel formed by a photosensitive region in a first semiconductor material, a read region in a second semiconductor material, and a transfer gate facing the parts of the first semiconductor material and the second semiconductor material located between the photosensitive region and the read region. The first semiconductor material and the second semiconductor material have different band gaps and are in contact with one another to form a heterojunction facing the transfer gate.

25 Claims, 5 Drawing Sheets

(56) References Cited

U.S. PATENT DOCUMENTS

2018/0350863 A1* 12/2018 Yamaguchi ............ H04N 25/76
2022/0392934 A1* 12/2022 Fukushima ......... H10F 39/8027
2023/0036227 A1*  2/2023 Kurotori ............... H10F 39/024

FOREIGN PATENT DOCUMENTS

| FR | 2988907 A1  | 10/2013 |
| FR | 2961631 A1  | 12/2023 |
| TW | 201727193 A |  8/2017 |
| WO | 2018191539 A1 | 10/2018 |

OTHER PUBLICATIONS

CN First Office Action and Search Report for counterpart CN Appl. No. 202210681758.0, report dated Jun. 25, 2025, 9 pgs.

* cited by examiner

PHOTOSENSITIVE SENSOR AND CORRESPONDING MANUFACTURING METHOD

PRIORITY CLAIM

This application claims the priority benefit of French Application for Patent No. 2106356, filed on Jun. 16, 2021, the content of which is hereby incorporated by reference in its entirety to the maximum extent allowable by law.

TECHNICAL FIELD

Embodiments and implementations relate to photosensitive sensors and, in particular, to photosensitive sensors capable of detecting radiation in a so-called short wavelength infrared range (SWIR).

BACKGROUND

Radiation in the short wavelength infrared range (SWIR) range usually has wavelengths between 1 μm and 2.5 μm, and are impossible to detect with silicon semiconductor devices.

Indeed, the energy of the photons of the SWIR range is less than the energy gap between the valence band and the conduction band (referred to as the forbidden band, or band gap, or gap) of silicon.

Accordingly, photosensitive sensors adapted to radiation of the SWIR range conventionally use semiconductor materials having a narrower band gap, usually referred to as "low band gap materials", such as for example indium-gallium arsenide (InGaAs). This type of material is usually described using the terms "III-V type material" or "III-V compound", in that the constituents thereof belong to groups III and V of the periodic table of the elements.

That being said, photosensitive sensor read and control circuits are conventionally formed of silicon. Accordingly, a hybrid integration technique with copper bonds between the silicon read circuit and the photosensitive element made of III-V material, must conventionally be used.

However, in conventional hybrid integrations, a read node (or memory node), used to store the charges photogenerated by the photosensitive element, is provided in the part made of silicon. Accordingly, reading of the read node is conventionally performed live, which introduces noise problems at reset, due to the inability to subtract the temporal noise (so-called kTC noise) from the read node, for example by means of a correlated double sampling technique.

Thus, there is a need in the art for a photosensitive sensor suitable for the SWIR wavelength range, having low noise, fast charge transfer, based on a non-cumbersome architecture.

SUMMARY

According to an aspect, a photosensitive sensor comprises at least one pixel including: a photosensitive region in a first semiconductor material, a read region in a second semiconductor material, and a transfer gate facing the parts of the first semiconductor material and the second semiconductor material located between the photosensitive region and the read region, the first semiconductor material and the second semiconductor material having different band gaps and being in contact with one another, forming a heterojunction facing the transfer gate.

In other words, a heterojunction photosensitive sensor is provided wherein the photosensitive region can be coupled with a read region by means of a charge transfer controlled by the transfer gate. Providing a transfer gate between a photosensitive region and a read region forms the basis of so-called 4 T (4 transistors) pixel technology, wherein the read region benefits from correlated double sampling reading.

The sensor is indeed advantageously configured so that a control signal applied on the transfer gate induces a charge transfer from the photosensitive region to a read node of the read region.

According to an embodiment, the first semiconductor material and the second semiconductor material are selected such that the energy level of the conduction band of the first semiconductor material is greater than the energy level of the conduction band of the second semiconductor material, and such that the energy level of the valence band of the first semiconductor material is greater than the energy level of the valence band of the second semiconductor material.

This type of arrangement of semiconductor materials in which the energy levels are positioned as defined above, is usually described as "type II".

In this configuration, there is a potential descent (i.e., a declining scale) at the level of the heterojunction, both between the energy levels of the respective conduction bands and between the energy levels of the respective valence bands, in the direction from the first semiconductor material to the second semiconductor material. On the other hand, there is a potential barrier (i.e., an increasing scale) both between the respective conduction bands and between the respective valence bands, in the direction from the second semiconductor material to the first semiconductor material.

In other words, the first and the second semiconductor material are selected such that the charges can flow in the direction from the first semiconductor material to the second semiconductor material, whereas a potential barrier opposes the flow of the charges in the direction from the second semiconductor material to the first semiconductor material.

This configuration results in a transfer subject to little or no electrical noise and little or no remanence following an incomplete charge transfer or a charge return (usually referred to as "lag").

According to an embodiment, the first semiconductor material is selected to be photosensitive in a wavelength range of interest, and the second semiconductor material is selected so as not to be photosensitive in the wavelength range of interest.

It is noted briefly that a semiconductor material can be photosensitive in a wavelength range corresponding to photons of energy greater than or equal to the width of the band gap of the semiconductor (i.e., the difference between the energy level of the conduction band and the energy level of the valence band of the semiconductor).

Thus, in this embodiment, the read region does not react intrinsically with the signal detected in the photosensitive region, and the read region cannot generate parasitic charges due to exposure to the signal to be detected.

This makes it possible to provide an even more accurate measurement, while offering easy embodiment given that it is not necessary to provide conventional screen structures blocking the transmission of the signal to be detected to the read region.

According to an embodiment, the wavelength range of interest is situated between 700 nm and 1800 nm.

According to an embodiment, the first semiconductor material is gallium arsenide antimonide (GaAsSb), and the second semiconductor material is indium phosphide (InP).

Indeed, this choice of semiconductor material makes it possible advantageously to simultaneously offer all the configurations of the embodiments defined above, and furthermore these materials have mutually compatible crystalline structures.

According to an embodiment, the first semiconductor material and the second semiconductor material are doped with the same type in the part located between the photosensitive region and the read region.

According to an embodiment, the photosensitive region is configured to generate charges by a photoelectric effect, and the read region is configured to store charges by a capacitive effect.

According to an embodiment, the photosensitive region includes doped regions of the first material arranged to form two PN junctions having respective space charge zones joined so as to form a fully depleted common region.

This type of photosensitive region embodiment is usually referred to as "pinned photodiode", or depleted diode.

According to a further aspect, the invention proposes a method for manufacturing a photosensitive sensor comprising at least a manufacture of a pixel comprising: arranging a first semiconductor material and a second semiconductor material having different band gaps in contact with one another to form a heterojunction; forming a transfer gate facing the heterojunction; forming parts of the first semiconductor material and the second semiconductor material located on either side of the heterojunction; and forming a photosensitive region in the first semiconductor material; forming a read region in the second semiconductor material; wherein the photosensitive region and the read region are formed on either side of the parts of the first semiconductor material and of the second semiconductor material facing the transfer gate.

According to an implementation, the first semiconductor material and the second semiconductor material are selected such that the energy level of the conduction band of the first semiconductor material is greater than the energy level of the conduction band of the second semiconductor material, and such that the energy level of the valence band of the first semiconductor material is greater than the energy level of the valence band of the second semiconductor material.

According to an implementation, the first semiconductor material is selected to be photosensitive in a wavelength range of interest, and the second semiconductor material is selected so as not to be photosensitive in the wavelength range of interest.

According to an implementation, the wavelength range of interest is situated between 700 nm and 1800 nm.

According to an implementation, the first semiconductor material is gallium arsenide antimonide (GaAsSb), and the second semiconductor material is indium phosphide (InP).

According to an implementation, the formation of the first semiconductor material and of the second semiconductor material comprises a doping of the same type of the first material and of the second material.

According to an implementation, the formation of the photosensitive region comprises an implantation of dopants in the first material which form a PN junction configured to generate charges by a photoelectric effect, and the formation of the read region comprises an implantation of dopants in the second material configured to store charges by a capacitive effect.

According to an embodiment, the formation of the photosensitive region further comprises a second implantation of dopants in the first material configured to form a second PN junction such that the two PN junctions of the photosensitive region have respective space charge zones that are joined and form a fully depleted common region.

According to an implementation, arranging the first semiconductor material and the second semiconductor material comprises: etching a cavity in a semiconductor substrate of the second material; and performing a heteroepitaxial growth of the first material in the cavity.

According to an implementation, arranging the first semiconductor material and the second semiconductor material comprises: performing a heteroepitaxial growth of a thickness of the first material on a surface of a semiconductor substrate of the second material; etching a cavity in the thickness of the first material until the second material is exposed; and performing a homoepitaxial growth of the second material in the cavity.

BRIEF DESCRIPTION OF THE DRAWINGS

Further advantages and features of the invention will emerge on studying the detailed description of embodiments and implementations, in no way restrictive, and of the appended drawings wherein.

DETAILED DESCRIPTION

Figure 1:
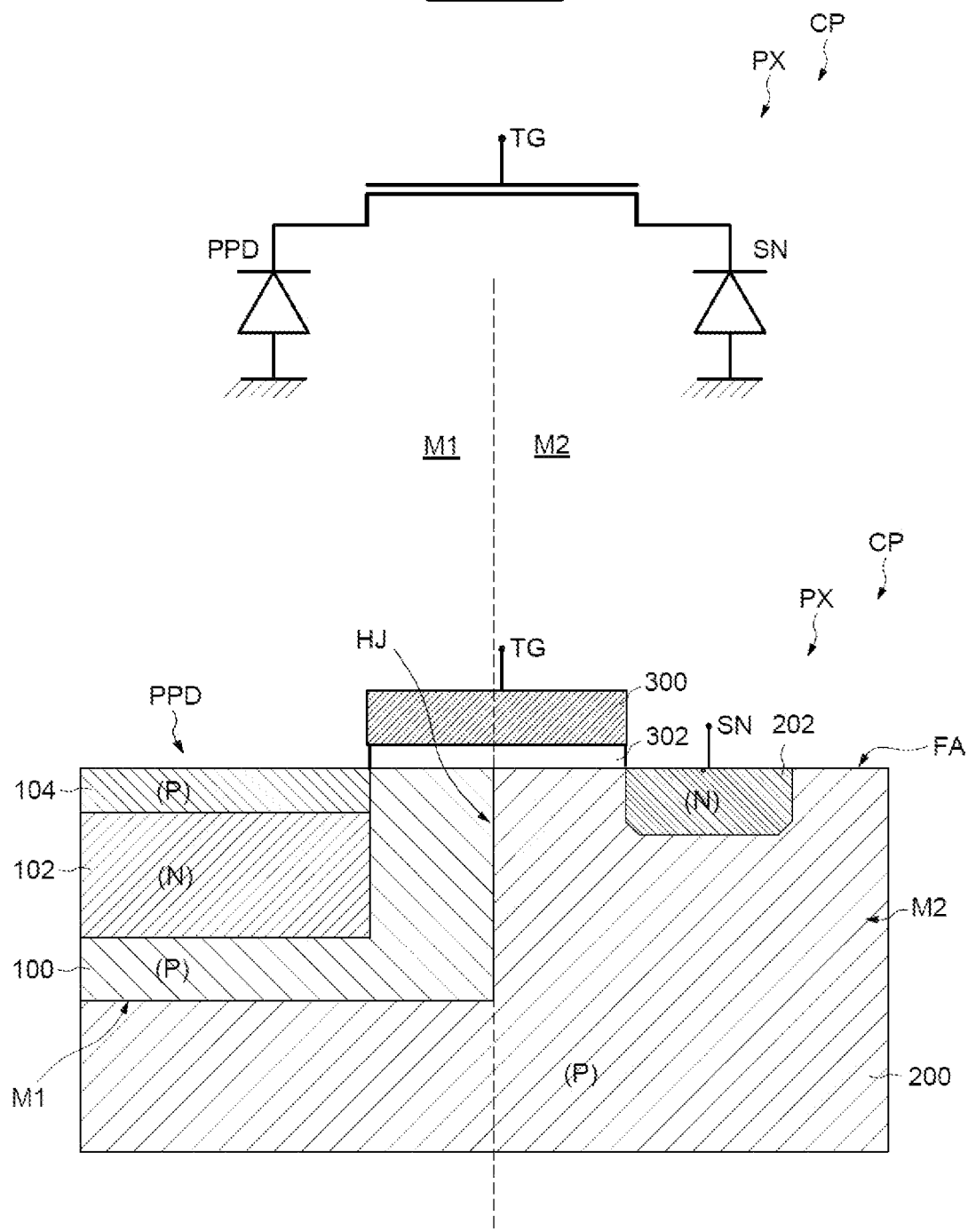
FIG. 1 illustrates a pixel of a photosensitive sensor in the form of an electrical diagram (top) and in a schematic sectional view of a semiconductor device (bottom)

FIG. 1 illustrates a pixel PX of a photosensitive sensor CP, in the form of an electrical diagram (top) and in a schematic sectional view of a semiconductor device including an example of embodiment of the pixel PX (bottom).

The pixel PX includes a photosensitive region PPD, a read region SN and a transfer gate TG between the photosensitive region PPD and the read region SN.

The photosensitive region PPD is made of a first semiconductor material M1, whereas the read region SN is made of a second semiconductor material M2, different from the first semiconductor material M1.

The first semiconductor material M1 and the second semiconductor material M2 thus have different band gaps and are in contact with one another, which forms a heterojunction HJ at the level of the contact zone thereof.

The transfer gate TG is located facing the heterojunction HJ and the parts of the first semiconductor material M1 and of the second semiconductor material M2 located between the photosensitive region PPD and the read region SN, on either side of the heterojunction HJ.

The photosensitive region PPD is configured to generate charges by a photoelectric effect, for example during an integration phase during which the photosensitive region PPD is irradiated by a light signal.

In this example, the photosensitive region PPD is a pinned photodiode embodiment, also known as "pinned diode" or "depleted diode", i.e., an embodiment including doped regions in the first material 100, 102, 104 arranged to form two PN junctions having respective space charge zones that are joined so as to form a fully depleted common region 102.

Indeed, the pinned photodiode PPD is formed in a semiconductor well 100 in the first material M1 and doped with a first type, for example P type. In this example, the well 100 has been incorporated in a substrate 200 formed in the second material M2.

The photodiode PPD includes a first region 102 implanted in the well 100 and doped with a second type opposite the first type, for example N type, as well as a second region 104 implanted more locally on the surface of the well 100 and doped with the first type, typically strongly doped.

The first doped region 102, i.e., the cathode region in the case of the N type, is thus "pinned" between the two PN junctions formed between the well 100 and the first doped region 102 and between the first doped region 102 and the second doped region 104. The implantation depths of the implanted regions 102, 104 and the concentrations of the dopants of the well 100 and the implanted regions 102, 104 are provided so that the space charge regions join in the first implanted region 102. Accordingly, the first implanted region 102, common to the two PN junctions, is fully depleted of minority carriers.

Alternatively, the photosensitive region PPD could be a "single" photodiode embodiment, i.e., a single PN junction, in a substantially identical embodiment to the embodiment described above, but without the second implanted region 104.

The read region SN is configured to store charges by a capacitive effect, for example during a read phase following the integration phase.

The read region SN is formed in the substrate 200, made in the second material M2 and doped with the first conductivity type, for example P type; and the read region SN includes a region 202 implanted in the substrate 200 and doped with the same type, for example N type.

The read region SN is thus represented by the diagram of a diode. The intrinsic capacitive value of the diode SN may be sufficient to enable storage of the desired charges. If the intrinsic capacitive value of the diode SN (is not sufficient, an ancillary capacitive element, for example a Metal-Oxide-Semiconductor (MOS) structure type capacitive element, can be coupled with the implanted region 202 to increase the charge storage capacity.

In particular, the charge storage function by the read region SN enables an implementation comprising non-simultaneous integration and read phases, separate over time. This is particularly the case of global shutter acquisition wherein the integration phase is performed in the same time interval for all the pixels of the sensor, whereas the read phase can be performed sequentially, at different times, in the read regions SN.

The transfer gate TG is configured to induce a conduction channel adapted to transfer photogenerated charges into the photosensitive region PPD to the read region SN, for example following the integration phase, and at the start of the read phase.

The transfer gate TG includes in this regard an embodiment of a conductive region 300, for example made of metal, separated from the semiconductor materials M1, M2 by a thickness of dielectric material 302.

The gate structure 300, 302 is formed on a face known as the front face FA of the first semiconductor material M1 and of the second semiconductor material M2. The front face FA is typically the face on which the implantations are made.

In particular, the lateral edges of the gate region 300 delimit the implantation zones of the implanted regions 102, 104 and 202 (by a so-called self-aligned method described hereinafter with reference to FIGS. 4A-4E and 5A-5D).

The gate structure 300, 302 is located facing the heterojunction HJ, and semiconductor regions located on either side of the heterojunction HJ. More specifically, the gate structure 300, 302 is located facing the part 100 of the first semiconductor material M1 located between the implanted regions 102, 104 of the pinned diode PPD and the heterojunction HJ; and further facing the part 200 of the second semiconductor material M2 located between the implanted region 202 of the read region SN and the heterojunction HJ.

Thus, by applying a control potential on the conductive gate region 300, a conduction channel can be formed in the semiconductor regions facing the transfer gate TG.

It will be noted in this regard that the well 100 formed in the first semiconductor material M1 and the substrate 200 formed in the second semiconductor material M2 are doped with the same type, for example P type, at least in the parts located between the photosensitive region PPD and the read region SN.

Furthermore, to enable the transfer of the charges from the photosensitive region PPD to the read region SN, the first and second semiconductor materials M1, M2 are advantageously selected to have an advantageous band diagram in terms of charge transfer.

Figure 2:
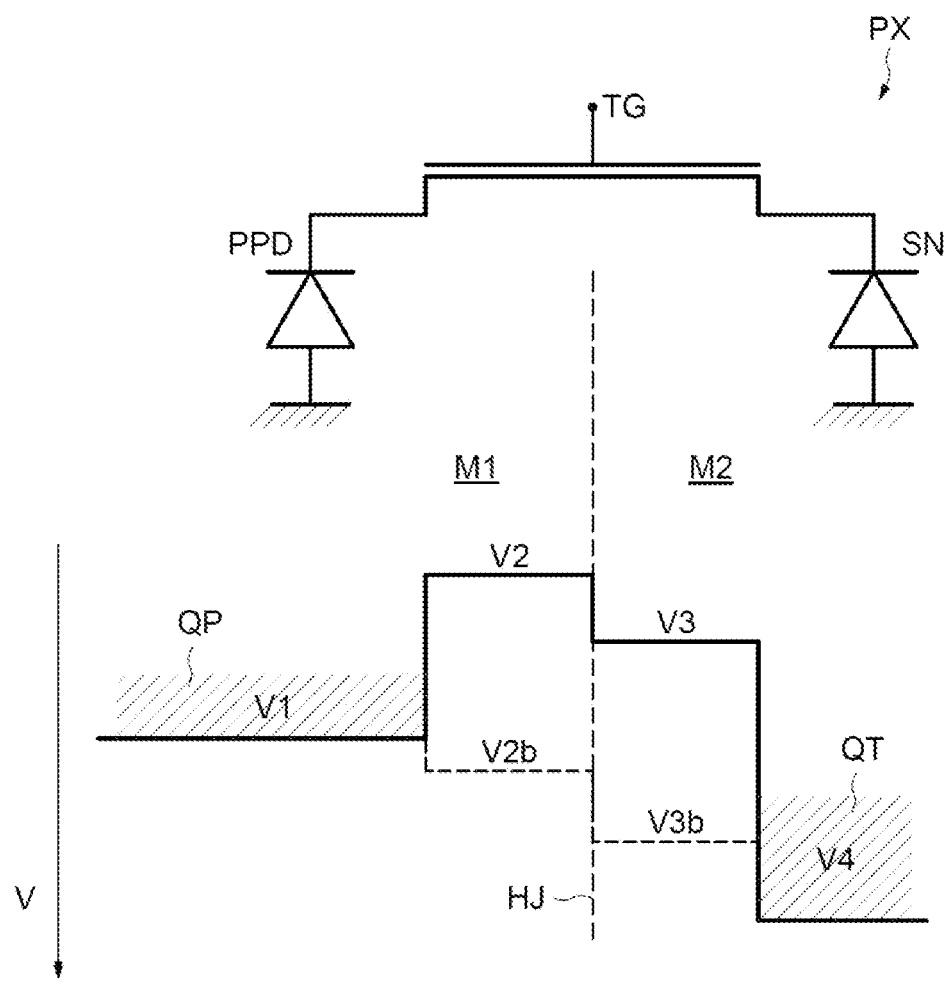
FIG. 2 illustrates the electrical diagram of the pixel (top) and a graph representing potential levels V present in the different regions and semiconductor materials of the pixel (bottom)
Figure 3:
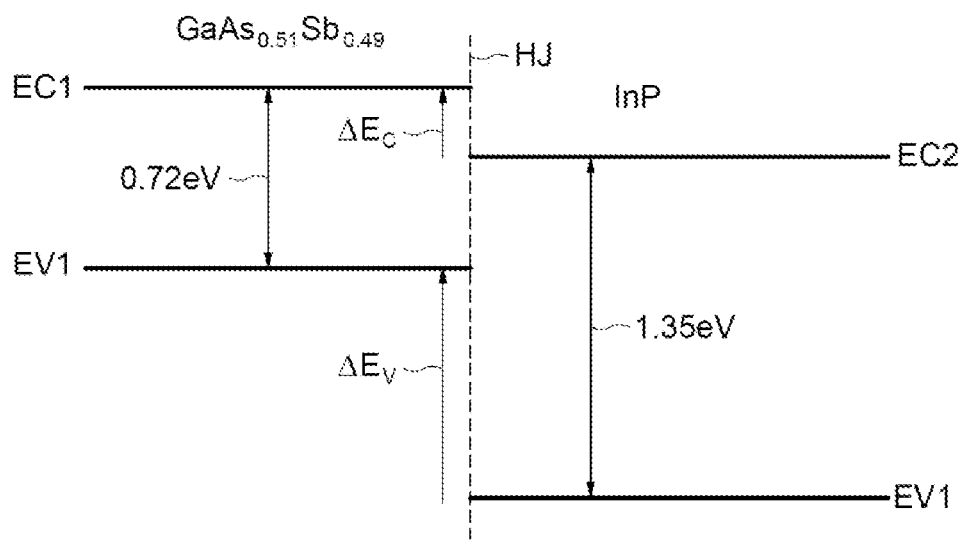
FIG. 3 illustrates the band diagram of a type II heterojunction.

Reference is made in this regard to FIGS. 2 and 3.

FIG. 2 illustrates the electrical diagram (top) of the pixel PX described above with reference to FIG. 1, and a graph representing the potential levels V present in the different regions and semiconductor materials of the pixel PX (bottom).

The dashed line HJ positions a reference corresponding to the position of the heterojunction HJ between the first semiconductor material M1 and the second semiconductor material M2, as illustrated in FIG. 1.

The relative positions of the potential levels V of the graph correspond to the example where the first doping type is P type, i.e., when the first material M1 of the well 100 and the second material M2 of the substrate 200 are P-type doped.

Thus, in this example, the photogenerated charges are electrons, and a potential barrier is formed by a decreasing spatial variation of the potential, whereas a potential well, or a potential "descent" (as opposed to a "barrier"), are formed by an increasing spatial variation of the potential.

In the case where the photosensitive region PPD is a pinned photodiode, the absence of mobile charge in the fully depleted region produces a constant reset effect at a level V1 known as "depletion potential".

The absence of the potential V2 in the part of the well 100 between the photosensitive region PPD and the heterojunction HJ defines a potential barrier for photogenerated charges QP in the photosensitive region PPD.

The level of the potential V3 in the part of the substrate 200 between the heterojunction HJ and the photosensitive region PPD is greater than the level V2, so as to define a "descent" for photogenerated charges QP transferred to the read node.

The level of the potential V4 on the read node SN is greater than the levels V2, V3 and the level of the depletion potential V1 of the pinned photodiode PPD, forming a potential "well" for the transferred charges QT.

To carry out a transfer of the photogenerated charges QP in the photosensitive region PPD to the read region SN, the transfer gate TG is brought to a positive potential greater than the inversion thresholds of the first material M1 and of the second material M2.

The levels of the potentials V2, V3 present between the photosensitive region PPD and the read region SN are increased to the respective levels V2b, V3b, greater than the level V1 and less than the level V4 and having the same difference therebetween.

Accordingly, the photogenerated charges QP are transferred to the read node SN, and when the transfer gate potential is brought to a level below the threshold, the transferred charges QT in the read node are trapped by the potential barrier between V4 and V3.

This configuration, in particular the fact that the potential V3 in the second material M2 is greater than the potential V2 in the first material M1, advantageously enables a transfer with little or no noise and with little or no lag.

This configuration is particularly obtained when the energy level of the conduction band of the first semiconductor material is greater than the energy level of the conduction band of the second semiconductor material, and the energy level of the valence band of the first semiconductor material is greater than the energy level of the valence band of the second semiconductor material.

This type of semiconductor material arrangement is usually described as "type II".

Reference is made in this regard to FIG. 3. FIG. 3 represents the band diagram of a type II heterojunction, formed by gallium arsenide antimonide (GaAsSb) and indium phosphide (InP).

Gallium arsenide antimonide GaAsSb has a stoichiometry of 0.49 antimony Sb and 0.51 arsenic As per unit of gallium Ga; i.e., "$GaAs_{0.51}Sb_{0.49}$".

In the embodiments of pixels PX described above with reference to FIGS. 1 and 2, the first semiconductor material M1 is advantageously gallium arsenide antimonide GaAsSb and the second semiconductor material M2 is advantageously indium phosphide InP.

Indeed, on one hand, these materials have a type II band structure, the energy of the conduction band EC1 of GaAsSb being greater by $\Delta E_C$ than the energy of the conduction band EC2 of InP; and the energy of the valence band EV1 of GaAsSb being greater by $\Delta Ev$ than the energy of the valence band EC2 of InP.

Moreover, the band gap of GaAsSb has a width of 0.72 eV (electron-Volt) whereas the band gap of InP has a width of 1.35 eV.

Accordingly, InP has a photoelectric effect for signals in which the wavelength is less than 920 nm (nanometers) whereas GaAsSb has a photoelectric effect for signals in which the wavelength is less than 1750 nm.

Accordingly, for wavelengths between 920 nm and 1750 nm, the first material M1 (GaAsSb) is photosensitive whereas the second material M2 (InP) is not photosensitive.

The first semiconductor material M1 can thus be selected to be photosensitive in a wavelength range of interest, and the second semiconductor material M2 so as not to be photosensitive in the wavelength range of interest.

In the example of GaAsSb and InP, the wavelength range of interest is, for example, located between 920 nm and 1750 nm.

Moreover, GaAsSb and InP have a good crystalline lattice compatibility and can thus be formed jointly in a stable manner.

FIGS. 4A to 4E illustrate results of steps of a method for manufacturing the pixel PX of the photosensitive sensor CP described with reference to FIGS. 1 and 2.

Figure 4A:
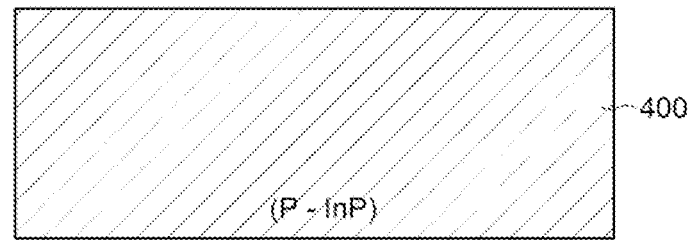
FIGS. 4A to 4E illustrate results of steps of a method for manufacturing the pixel of the photosensitive sensor described with reference to FIGS. 1 and 2.

FIG. 4A represents a semiconductor substrate 400 formed of the second semiconductor material. In this example, the second material is indium phosphide InP. The substrate 400 is P-type doped, for example by implantation, or by in situ addition, of Zinc Zn impurities.

Figure 4B:
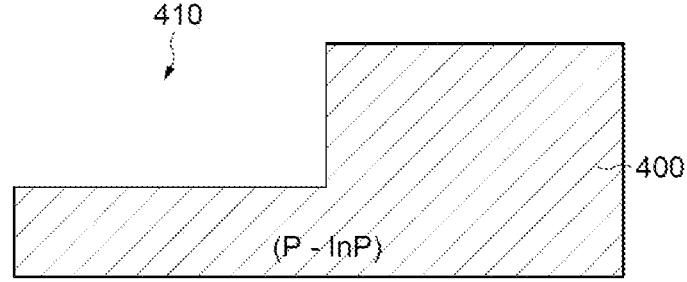

FIG. 4B represents the result of an etching of a cavity 410 in the semiconductor substrate 400. The etching can be dry etching type, such as plasma etching or reactive ion etching (RIE).

Figure 4C:
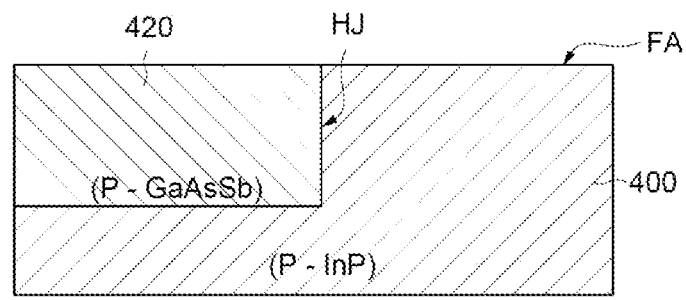

FIG. 4C represents the result of a heteroepitaxial growth of the first semiconductor material 420 in the cavity 410 open in the substrate 400. In this example, the first material is gallium arsenide antimonide GaAsSb. Thus, a well 420 of the first material is incorporated in the second material of the substrate 400. The well 420 of the first material is P-type doped, for example in situ, by introducing carbon C impurities during the formation thereof.

Heteroepitaxy denotes technique for growing a crystal (GaAsSb), typically in vapor phase, on a crystal (InP) of a different chemical nature. The crystalline structures of GaAsSb and InP have a good mutual lattice compatibility, which is advantageous in terms of reducing risk of dislocation between the first material and the second material.

A first semiconductor material 420 and a second semiconductor material 400 having different band gaps and being in contact with one another, forming a heterojunction HJ, are thus formed.

After growth of the first material 420, a levelling can optionally be provided to level in the same plane, referred to as front face FA, the surfaces of the first semiconductor material 420 and the second semiconductor material 400.

Figure 4D:
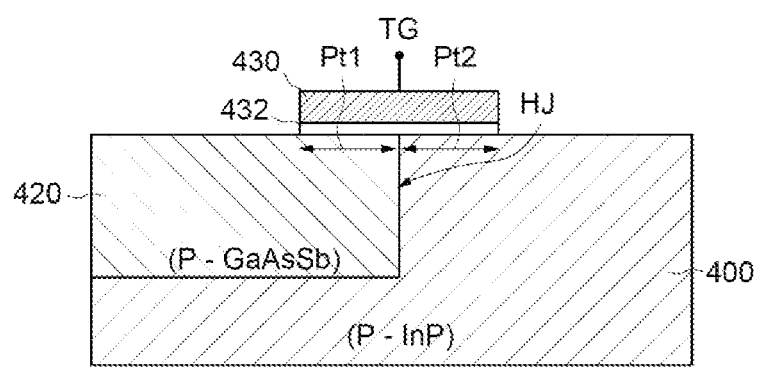

FIG. 4D represents the result of a formation of a transfer gate TG facing the heterojunction HJ and parts of the first semiconductor material Pt1 and of the second semiconductor material Pt2 located on either side of the heterojunction HJ.

In this regard, a dielectric layer 432 has been formed on the front face FA of the substrate 400 and the well 420, as well as a conductive layer 430 on the dielectric layer 420. The stack of layers 430, 432 is then masked and etched in the parts not covered by the mask.

The unetched part of the stack of layers 430, 432 forms the transfer gate TG, and is located facing the heterojunction HJ and parts of the first semiconductor material Pt1 and of the second semiconductor material Pt2 located on either side of the heterojunction HJ.

Figure 4E:
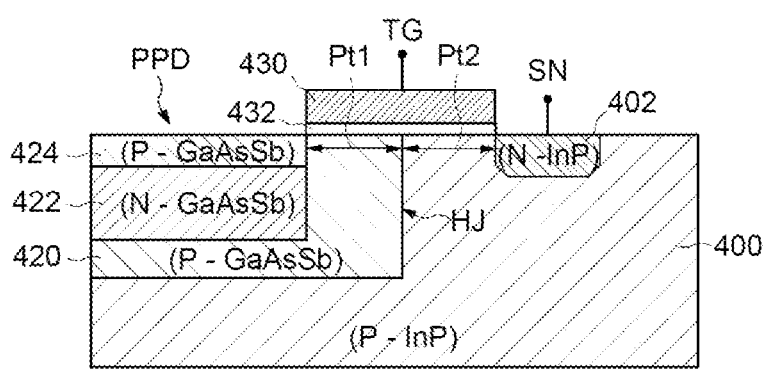

FIG. 4E represents the result of a formation of the photosensitive region PPD in the first semiconductor material 420 and of the read region SN in the second semiconductor material 400.

The formation of the photosensitive region PPD comprises a first implantation of N-type dopants 422, in the P-type well 420.

A first PN junction is thus formed between the N-type doped region 422 and the well 420, which could be capable of generating charges by a photoelectric effect, within the scope of a single photodiode embodiment.

The formation of the photosensitive region PPD advantageously further comprises a second implantation of P-type dopants 424, on the surface of the well 420. A second PN junction is thus formed between the N-type doped region 422 and the P-type doped region 424.

The concentrations and depths of the implantations of dopants 420, 422, 424 to form the photosensitive region PPD are provided in such a way that the two junctions PN have respective space charge zones which are joined and form a fully depleted region 422.

The formation of the read region SN comprises an implantation of N-type dopants 402 in the second material 400, for example silicon Si impurities.

The implanted region 402 is adapted to store charges by a capacitive effect. The method can optionally provide a formation of an additional capacitive element, for example a conventional MOS type capacitive element, coupled with the read region SN in order to increase the charge storage capacity.

During the implantations of the regions 422, 424 and 402, the transfer gate thus formed facing the heterojunction HJ forms an opaque mask to the implanted impurities. The lateral edges of the transfer gate TG thus delimit the implantation zones of the regions 422, 424 and 402, in a self-aligned manner.

FIGS. 5A to 5D illustrate results of steps of an alternative method for manufacturing the pixel PX of the photosensitive sensor CP described with reference to FIGS. 1 and 2.

Figure 5A:
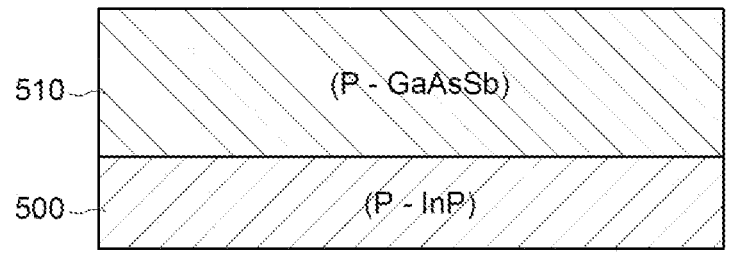
FIGS. 5A to 5D illustrate results of steps of an alternative method for manufacturing the pixel of the photosensitive sensor described with reference to FIGS. 1 and 2.

FIG. 5A represents a semiconductor substrate 500 formed by the P-type doped second semiconductor material, for example indium phosphide InP. A thickness of the first material 510, for example gallium arsenide antimonide GaAsSb formed by a heteroepitaxial growth, covers the surface of the substrate 500.

Figure 5B:
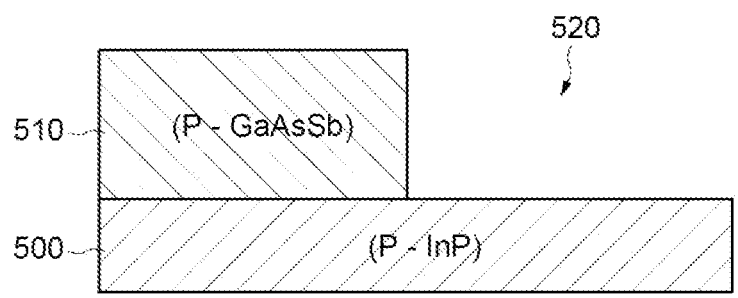

FIG. 5B represents the result of an etching of a cavity 520 in the thickness of the first material 510, until the second material 500 is exposed.

Figure 5C:
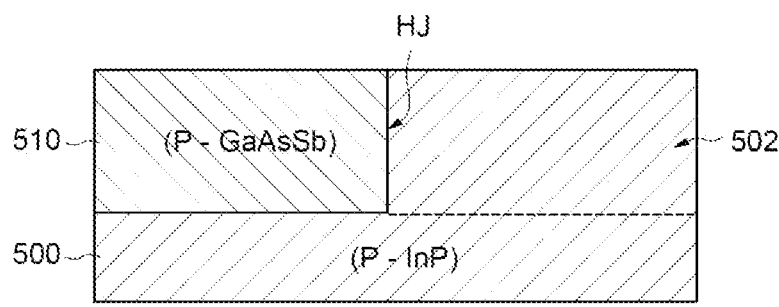

FIG. 5C represents the result of a homoepitaxial growth of the second material 502 in the cavity 520, from the exposed surface of the second material 500.

A well 510 is thus formed in the first material in contact with a well in the second material 502, thus forming a heterojunction HJ between them.

Figure 5D:
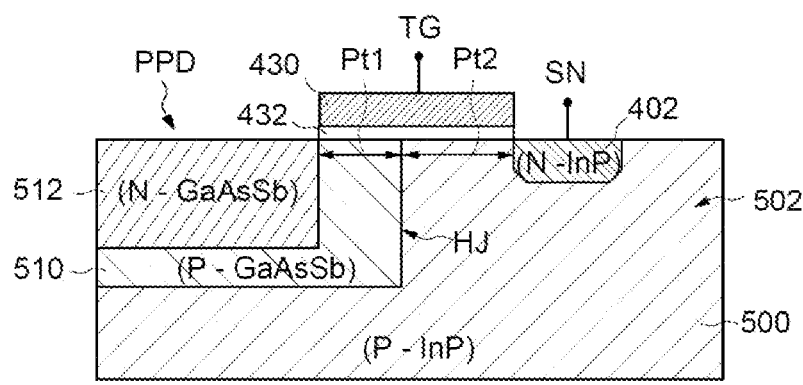

FIG. 5D represents the result of a formation of the read region SN and of the photosensitive region PPD according to a "single" photodiode alternative.

In this alternative, the second P-type implantation (424—FIG. 4E) is not embodied, the only implantation of the N-type region 512 forms a single PN junction with the well 510. The implantation of the N-type read region 402 in the well 502 is performed in a manner equivalent to the step described with reference to FIG. 4E.

The alternative embodiment of the "single" photodiode described with reference to FIG. 5D has no particular link with the alternative of forming the wells 510, 502 from different semiconductor materials, described with reference to FIGS. 5A, 5B and 5C.

In sum, a heterojunction photosensitive sensor has been represented, wherein the photosensitive region PPD, formed in a first semiconductor material, can be coupled with a read region SN, formed in a second semiconductor material different from the first, by means of a charge transfer controlled by the transfer gate TG via the heterojunction HJ. Providing a transfer gate TG between a photosensitive region and a read region SN forms the basis of so-called 4T (4 transistors) pixel technology, wherein the read region SN benefits from correlated double sampling reading.

In sum, correlated double sampling is a technique comprising a sampling of a reference level of the read node, including in particular the reset noise, before the transfer of the charges and comprising a sample of the signal level including particular the reset noise and the signal. The reset noise can therefore be subtracted so as to only retain the value of the signal of the read node SN.

The photosensitive sensor CP can comprise a plurality of such pixels PX arranged in a photosensitive matrix, in particular in an embodiment of an imager dedicated to the short wavelength infrared (SWIR) range.

The imager in the SWIR range including the photosensitive sensor CP as described above can, for example, be intended for time-of-flight measurements, i.e., an acquisition of a depth map resulting from the time elapsed between the time of emission of a signal illuminating a scene, for example in the SWIR range, and the time of reception of this signal reflected by elements of the scene.

A time-of-flight measurement imager including the photosensitive sensor CP as described above can, for example, be applied in the context of self-driving car sensors, or a biometric identification measurement such as the shape of a face.

The invention claimed is:

1. A photosensitive sensor, comprising:
   at least one pixel, where each pixel includes:
      a photosensitive region in a first semiconductor material;
      a read region in a second semiconductor material; and
      a transfer gate facing parts of the first semiconductor material and the second semiconductor material located between the photosensitive region and the read region;
   wherein the first semiconductor material has a first band gap and the second semiconductor material has a second band gap different from the first band gap; and
   wherein the first semiconductor material is in contact with the second semiconductor material to form a heterojunction located vertically underneath a conductive region of the transfer gate.

2. The photosensitive sensor according to claim 1, wherein an energy level of a conduction band of the first semiconductor material is greater than an energy level of a conduction band of the second semiconductor material, and wherein an energy level of a valence band of the first semiconductor material is greater than an energy level of a valence band of the second semiconductor material.

3. The photosensitive sensor according to claim 1, wherein the first semiconductor material is photosensitive in a wavelength range of interest, and the second semiconductor material is not photosensitive in the wavelength range of interest.

4. The photosensitive sensor according to claim 3, wherein the wavelength range of interest is situated between 700 nm and 1800 nm.

5. The photosensitive sensor according to claim 1, wherein the first semiconductor material is gallium arsenide antimonide (GaAsSb) and the second semiconductor material is indium phosphide (InP).

6. A photosensitive sensor, comprising:
   at least one pixel, where each pixel includes:
      a photosensitive region in a first semiconductor material;
      a read region in a second semiconductor material; and
      a transfer gate facing parts of the first semiconductor material and the second semiconductor material located between the photosensitive region and the read region;

wherein the first semiconductor material has a first band gap and the second semiconductor material has a second band gap different from the first band gap; and wherein the first semiconductor material is in contact with the second semiconductor material to form a heterojunction facing the transfer gate;

wherein the first semiconductor material and the second semiconductor material are doped with a same conductivity type in the parts of the first semiconductor material and the second semiconductor material located between the photosensitive region and the read region.

7. The photosensitive sensor according to claim 6, wherein an energy level of a conduction band of the first semiconductor material is greater than an energy level of a conduction band of the second semiconductor material, and wherein an energy level of a valence band of the first semiconductor material is greater than an energy level of a valence band of the second semiconductor material.

8. The photosensitive sensor according to claim 6, wherein the first semiconductor material is photosensitive in a wavelength range of interest, and the second semiconductor material is not photosensitive in the wavelength range of interest.

9. The photosensitive sensor according to claim 6, wherein the first semiconductor material is gallium arsenide antimonide (GaAsSb) and the second semiconductor material is indium phosphide (InP).

10. The photosensitive sensor according to claim 6, wherein the photosensitive region is configured to generate charges by a photoelectric effect and the read region is configured to store charges by a capacitive effect.

11. The photosensitive sensor according to claim 6, wherein the photosensitive region includes doped regions of the first semiconductor material arranged to form two PN junctions having respective space zones joined so as to form a fully depleted common region.

12. The photosensitive sensor according to claim 1, wherein the photosensitive region is configured to generate charges by a photoelectric effect and the read region is configured to store charges by a capacitive effect.

13. The photosensitive sensor according to claim 1, wherein the photosensitive region includes doped regions of the first semiconductor material arranged to form two PN junctions having respective space zones joined so as to form a fully depleted common region.

14. The photosensitive sensor of claim 1, wherein the second semiconductor material includes a cavity and the first semiconductor material is heteroepitaxial material located in the cavity.

15. The photosensitive sensor of claim 1, wherein the second semiconductor material comprises a semiconductor substrate, wherein the first semiconductor material is a heteroepitaxial layer a surface of the semiconductor substrate, wherein the first semiconductor material includes a cavity and wherein the second semiconductor material further comprises homoepitaxial material located in the cavity.

16. A pixel of a photosensitive sensor, comprising:
a first semiconductor material;
a second semiconductor material;
wherein the first semiconductor material and second semiconductor material have different band gaps;
wherein the first semiconductor material and second semiconductor material are arranged to form a heterojunction;
wherein a part of the first semiconductor material and a part of the second semiconductor material are located on either side of the heterojunction;
a transfer gate including a conductive region vertically underneath of which the heterojunction is located;
a photosensitive region in the first semiconductor material; and
a read region in the second semiconductor material.

17. The pixel of claim 16, wherein the photosensitive region is located on one side of the parts and the read region is located on an opposite side of the parts, and said parts are both vertically underneath the conductive region of the transfer gate.

18. The pixel of claim 16, wherein an energy level of a conduction band of the first semiconductor material is greater than an energy level of a conduction band of the second semiconductor material.

19. The pixel of claim 16, wherein an energy level of a valence band of the first semiconductor material is greater than an energy level of a valence band of the second semiconductor material.

20. The pixel of claim 16, wherein the first semiconductor material is photosensitive and the second semiconductor material is not photosensitive.

21. The pixel of claim 16, wherein the first semiconductor material is gallium arsenide antimonide (GaAsSb) and the second semiconductor material is indium phosphide (InP).

22. The pixel of claim 16, wherein the photosensitive region comprises a PN junction configured to generate charges by a photoelectric effect.

23. The pixel of claim 16, wherein the photosensitive region comprises:
a first PN junction; and
a second PN junction;
wherein the first and second PN junctions have respective space charge zones that are joined and form a fully depleted common region configured to generate charges by a photoelectric effect.

24. The pixel of claim 16, wherein the second semiconductor material includes a cavity and the first semiconductor material is heteroepitaxial material located in the cavity.

25. The pixel of claim 16, wherein the second semiconductor material comprises a semiconductor substrate, wherein the first semiconductor material is a heteroepitaxial layer a surface of the semiconductor substrate, wherein the first semiconductor material includes a cavity and wherein the second semiconductor material further comprises homoepitaxial material located in the cavity.

* * * * *